US008213637B2

(12) United States Patent
Brännmark et al.

(10) Patent No.: US 8,213,637 B2
(45) Date of Patent: Jul. 3, 2012

(54) SOUND FIELD CONTROL IN MULTIPLE LISTENING REGIONS

(75) Inventors: Lars-Johan Brännmark, Uppsala (SE); Mikael Sternad, Uppsala (SE); Mathias Johansson, Uppsala (SE)

(73) Assignee: Dirac Research AB, Uppsala (SE)

( * ) Notice: Subject to any disclaimer, the term of this patent is extended or adjusted under 35 U.S.C. 154(b) by 523 days.

(21) Appl. No.: 12/453,958

(22) Filed: May 28, 2009

(65) Prior Publication Data

US 2010/0305725 A1 Dec. 2, 2010

(51) Int. Cl.
*H03G 5/00* (2006.01)

(52) U.S. Cl. ........................................................ 381/98

(58) Field of Classification Search .............. 381/56–59, 381/97–103; 700/94

See application file for complete search history.

(56) References Cited

U.S. PATENT DOCUMENTS

| | | | | |
|---|---|---|---|---|
| 5,727,066 | A | 3/1998 | Elliott et al. | |
| 5,862,227 | A | 1/1999 | Orduna-Bustamante et al. | |
| 5,910,990 | A | 6/1999 | Jang | |
| 5,949,894 | A | 9/1999 | Nelson et al. | |
| 6,760,451 | B1 * | 7/2004 | Craven et al. | 381/98 |
| 7,215,787 | B2 | 5/2007 | Sternad et al. | |
| 2004/0223620 | A1 | 11/2004 | Horback et al. | |
| 2006/0067535 | A1 | 3/2006 | Culbert et al. | |
| 2009/0238380 | A1 * | 9/2009 | Brannmark et al. | 381/98 |

FOREIGN PATENT DOCUMENTS

| | | | |
|---|---|---|---|
| EP | 1355509 | * | 10/2003 |
| EP | 1355509 | A | 10/2003 |
| WO | 94/24835 | | 10/1994 |
| WO | 2007016527 | A | 2/2007 |

OTHER PUBLICATIONS

European Search Report in Corresponding Application EP 09007142 Date Oct. 27, 2009.

Sascha Spors et al., "The Theory of Wave Field Synthesis Revisited", Presented at AES 124th Convention, Amsterdam, preprint 7358, May 2008, Audio Engineering Society.

M. A. Poletti, "Three-Dimensional Surround Sound Systems Based on Spherical Harmonics", J. Aud. Eng. Soc., Nov. 2005, pp. 1004-1025, vol. 53, No. 11.

Arnaud Laborie et al., "Reproducing multichannel sound on any speaker layout", Audio Engineering Society AES 118th Convention, Barcelona, Spain, May 2005, paper 6375.

(Continued)

*Primary Examiner* — Calvin Lee

(74) *Attorney, Agent, or Firm* — Young & Thompson

(57) ABSTRACT

A scheme to design an audio precompensation controller for a multichannel audio system, with a prescribed number N of loudspeakers in prescribed positions so that listeners positioned in any of P>1 spatially extended listening regions should be given the illusion of being in another acoustic environment that has L sound sources located at prescribed positions in a prescribed room acoustics. The method provides a unified joint solution to the problems of equalizer design, crossover design, delay and level calibration, sum-response optimization and up-mixing. A multi-input multi-output audio precompensation controller is designed for an associated sound generating system including a limited number of loudspeaker inputs for emulating a number of virtual sound sources. Method includes: estimating, for each loudspeaker input signals, an impulse response at each of a set of measurement positions that cover the P listening regions; specifying a target impulse response (target stages) for each virtual sound source at each measurement position; and determining adjustable filter parameters of the audio precompensation controller so that a criterion function is optimized.

20 Claims, 7 Drawing Sheets

OTHER PUBLICATIONS

Mark Poletti, "An Investigation of 2D Multizone Surround Sound Systems", Audio Engineering Society AES 125th Convention, San Francisco, Oct. 2008, Convention paper 7551.

S. J. Elliott et al., "Multiple-Point Equalization in a Room Using Adaptive Digital Filters", J. Audio. Eng. Soc., Nov. 1989, pp. 899-907, vol. 32, No. 11.

Ole Kirkeby et al., "Fast Deconvolution of Multichannel Systems Using Regularization", IEEE Transactions on Speech and Audio Processing, Mar. 1998, pp. 189-195, vol. 6, No. 2, IEEE.

Huibert Kwakernaak et al., "Linear Optimal Control Systems", 1972, Wiley-Interscience, New York.

Brian D.O. Anderson et al., "Optical Control: Linear Quadratic Methods", 1989, Prentice-Hall International, Inc., London.

Vladimir Kucera, "Analysis and Design of Discrete Linear Control Systems", 1989, Academia Prague and Prentice-Hall International, London.

M. Sternad et al., "LQ controller design and self-tuning control", Sections 3.1-3.3 in Polynomial Methods in Optimal Control and Filtering, K. Hunt ed. 1993, pp. 56-92, Peter Peregrinus Ltd., London.

* cited by examiner

SOUND FIELD CONTROL IN MULTIPLE LISTENING REGIONS

TECHNICAL FIELD OF THE INVENTION

The file of this patent contains at least one drawing executed in color. Copies of this patent with color drawings will be provided by the Patent and Trademark Office upon request and payment of the necessary fee.

The present invention generally concerns digital audio precompensation and more particularly the design of a digital audio precompensation controller that generates several signals to a sound generating system, with the aim of modifying the dynamic response of the compensated system, as measured in several spatially separated listening regions.

BACKGROUND OF THE INVENTION

An audio reproduction system is affected by imperfect loudspeaker dynamics and room acoustics. The audio system may furthermore have loudspeakers placed in inappropriate positions. For example, sound material intended for a 5.1 surround system is to be reproduced by loudspeakers in standardized positions, but the number and positioning of loudspeakers in a home or in a car may differ from the specified setting. All of these problems are frequently encountered in home-cinema and audio systems and they are particularly hard to solve for car audio systems with their often awkward loudspeaker positions and difficult acoustic environments.

For example, consider the tuning process of car audio systems, that today proceeds in several steps. First, crossover filters are set and each loudspeaker is equalized on a per-channel basis; then the delay and level for each channel is set to reach a desired sound stage (spatial sound perception); additional adjustments to filter responses are made with respect to the combined acoustic loudspeaker responses; finally, parameters for up-mixing are adjusted. Up-mixing here refers to the process of distributing stereo or discrete 5.1 material to the N loudspeakers in the car.

The end goal of the tuning process for cars or home hifi/cinema systems can be described in terms of a target sound field in the listening environment. The target sound field is in general continuous in space.

In this context it is generally an objective to design a set of pre-compensating filters for a multichannel audio system, with N loudspeaker inputs. It is desirable to jointly optimize the filters to provide a unified joint solution to all of the above design steps: equalizer design, crossover design, delay and level calibration, sum-response optimization and up-mixing. As a result, listeners positioned at any of $P>1$ listening regions should ideally be given the illusion of being in another acoustic environment that has L sound sources (virtual loudspeakers) that are located at prescribed positions in a prescribed room acoustics. To make the solution practical, the volume of the listening positions should allow for some head movement of the listener. The best possible approximation of this goal should be attained for a given sound reproduction system, with given loudspeaker numbers, positions and properties. In particular, the solution should not require the loudspeakers to be located in particular positions with respect to the listeners and also not require them to consist of arrays with prescribed spatial properties.

In the literature, there are essentially three different theoretical approaches to the problem of reconstructing sound fields, none of which solves the above described problem in an adequate way.

1. Wave Field Synthesis (WFS), which is based on Huygens Principle, or the Kirchhoff-Helmholtz integral representation of sound fields [1]. This method can recreate the complete sound field in one single continuous region in space. However, it is based on ideal assumptions regarding the transducers and the acoustic environment where the reproduction takes place, assuming a large number of ideal transducers and an ideal room acoustics. In practical systems, these assumptions are never fulfilled.
2. High Order Ambisonics (HOA), based on a Fourier-Bessel series expansion of the original and desired sound fields in spherical coordinates [2]. It aims at sound field reconstruction within one single spherical region and is thus not suitable for reproduction over arbitrary spatial regions. The filter design has to be performed for each frequency separately [3]. For multiple frequencies, this would result in filters for which there is no control of the time domain properties. The paper [4] presents a design that uses a circular array of loudspeakers to produce a target sound field in one sub-region inside the circle, while silence is produced in three other regions, for one single frequency. This solution, and HOA techniques in general are unsuited for our purposes, because their lack of control of time-domain signal properties.
3. Multipoint Mean Square Error (MSE) based methods, in which the error between the desired and the reconstructed sound field is minimized on a discrete grid of measurement points [5]. Such methods have been proposed for reproducing sources at virtual positions, as perceived at the ear positions of a listener [6],[7],[9], where, typically, two measurement positions are used per listening position, locat at the ear positions and the required number of loudspeakers is twice as large as the number of listening positions. Such solutions are basically based on so-called cross-talk cancellation or inversion of the acoustic channel matrices. They are known to be extremely sensitive to the position of the listener, and this non-robustness makes them unsuitable for practical applications. Another special application is that of making specialized recordings with microphones placed in particular positions, and then re-creating those sound signals in other positions [8],[10]. That objective differs from ours, where the recordings are arbitrary, but should be perceived as being played over a new set of loudspeakers, in a different room. MSE optimization is in general implemented by frequency-domain methods [11], which provide little control of the time domain properties of the resulting filters, in particular the "pre-response" or "pre-ringing" part of compensated systems. This lack of control of time-domain aspects reduces control of the spatial aspects, such as wave front angles of arrival at different positions.

The Linear Quadratic Control method for audio precompensation controller design presented in [12] provides means for attaining precise control of the time-domain properties as well as the frequency domain properties of the compensated system. However, the particular solution presented in [12] is based on a filter structure with a nonzero and fixed parallel path between the inputs and the outputs of the precompensator. This would be an inappropriate structural constraint on a solution to the above stated multichannel design problem; there is here no reason for one virtual source to be assigned to one particular subset of loudspeakers via a fixed part of a precompensation controller.

The design schemes available in prior art are thus not adequate for the stated design goal.

SUMMARY OF THE INVENTION

It is a general objective of the present invention to provide an improved design scheme for an audio precompensation controller for multichannel audio systems.

It is a specific objective to provide a method for determining an audio precompensation controller for an associated sound generating system.

It is another specific objective to provide a system for determining an audio precompensation controller for an associated sound generating system.

It is yet another specific objective to provide a computer program product for determining an audio precompensation controller for an associated sound generating system.

It is another specific objective of the invention to provide a method to design or determine a set of pre-compensating filters for a multichannel audio system that has a prescribed set of loudspeakers in prescribed positions with N separate loudspeaker inputs, so that listeners positioned in any of $P>1$ spatially extended but separated listening regions should be given the illusion of being in a pre-defined acoustic environment that has L sound sources (virtual loudspeakers) that are located at prescribed positions.

These and other objects are met by the invention as defined by the accompanying patent claims.

The present invention is based on the recognition that mathematical models of dynamic systems, and model-based optimization of digital precompensation filters, provide powerful tools for designing filters that improve the performance of various types of audio equipment by modifying the input signals to the equipment. It is furthermore based on the recognition that appropriate models can be obtained by measurements at a discrete grid of M listening positions, with a plurality of listening positions located in each of the P listening regions.

A basic idea is to determine an audio precompensation controller for an associated sound generating system. The sound generating system comprises a limited number $N \geqq 2$ of loudspeaker inputs for emulating a number $L \geqq 1$ of virtual sound sources each of which has an available input signal. The audio precompensation controller has the L input signals to the virtual sound sources as inputs and produces N signals as outputs. These precompensation controller output signals are used as input signals to the sound generating system. The novel scheme for designing or determining the audio precompensation controller is based on:

- estimating, for of each of the N loudspeaker input signals, an impulse response at each of a plurality M of measurement positions in a listening environment based on sound measurements at said M measurement positions. The M measurement positions are distributed in at least two spatially disjoint regions. Each of these regions has at least four measurement positions. The listening regions correspond to different human listening positions and distance between regions is larger than the largest distance between adjacent measurement positions within any region.
- Specifying a target impulse response for each of the L virtual sound sources at each of the M measurement positions in the spatially disjoint regions.
- Determining adjustable filter parameters of the audio precompensation controller so that a criterion function is optimized under the constraint of stability of the dynamics of the controller. The criterion function includes a weighted summation of powers of differences between the compensated estimated impulse responses and the target impulse responses over a discrete grid of the M measurement positions.

The different aspects of the invention include a method, system and computer program for determining an audio precompensation controller, a so determined precompensation controller, an audio system incorporating such an audio precompensation controller as well as a digital audio signal generated by such an audio precompensation controller.

The present invention offers the following advantages:

- It enables optimized sound field control using a limited number of loudspeakers, by focusing the approximation accuracy in at the spatial regions of most importance, the listening regions. This is done without placing hard restrictions on the placement or other properties of the loudspeakers.
- It may also provide a unified solution to the inter-related problems of equalizing the frequency response, designing crossover filters, adjusting delays and sound levels to obtain an appropriate spatial staging, optimizing the sum power response when simultaneously using multiple loudspeakers, and to construct up-mixing from L sound sources to N loudspeakers inputs.
- It enables good control of the temporal and therefore also spatial properties of the solution. This may be obtained by using e.g. a linear-quadratic Gaussian design of a multivariable feedforward controller.
- It finally offers means of approximating the multi-input multi-output high-order controller structure e.g. by connections of sets of lower order scalar filters.

Other advantages and features offered by the present invention will be appreciated upon reading of the following description of the embodiments of the invention.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings, the same reference numbers are used for similar or corresponding elements.

As mentioned, the present invention is based on the recognition that mathematical models of dynamic systems, and model-based optimization of digital precompensation filters, provide powerful tools for designing filters that improve the performance of various types of audio equipment by modifying the input signals to the equipment. It is furthermore based on the recognition that appropriate models can be obtained by measurements at a discrete grid of M listening positions, with a plurality of listening positions located in each of the P listening regions.

A first key insight is that a solution can be regarded as acceptable for practical applications if we alleviate the requirement on perfect reconstruction of the target sound field and further limit our target to cover only a finite number of measurement positions. By sampling the sound field at a limited number M of positions in the listening area, positions that with adequate resolution cover all relevant listener positions, we discretize the problem and can work directly with N×M transfer functions. A second key observation is that such a set of measurement positions needs to cover several disjoint volumes in space, centered on head positions at several intended listening positions. Concentrating the design accuracy on these spatial volumes, instead of targeting the whole room volume, improves the possibility of obtaining a good result with a limited number of loudspeakers.

Figure 1:
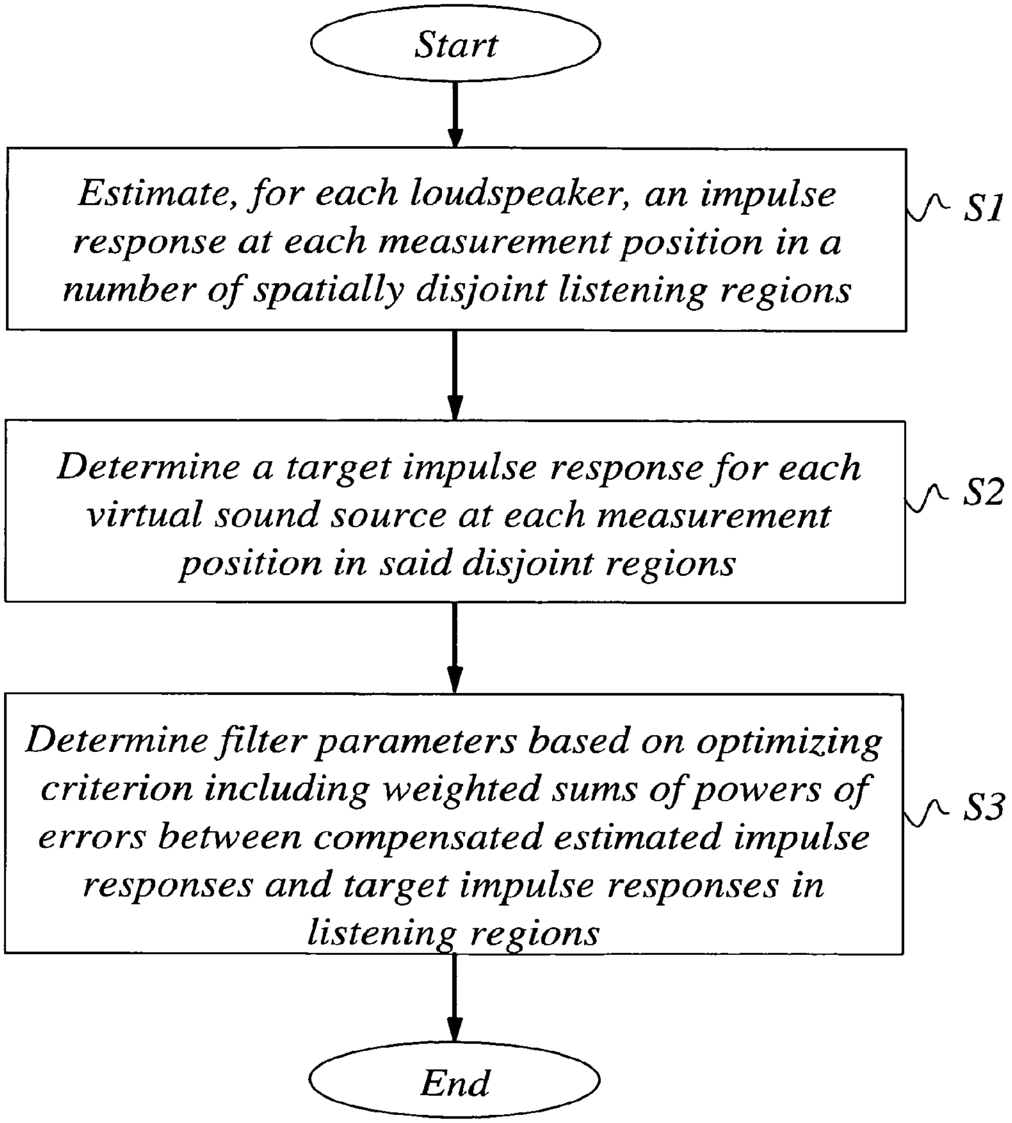
FIG. 1 is a schematic flow diagram illustrating a method for determining an audio controller according to an exemplary embodiment.

FIG. 1 is a schematic flow diagram illustrating a method for determining an audio controller according to an exemplary embodiment. Step S1 involves estimating, for each of said N loudspeaker input signals, an impulse response at each of a plurality M of measurement positions in a listening environment based on sound measurements at said M measurement positions. The M measurement positions are distributed in at least two spatially disjoint listening regions, where each listening region has at least four measurement positions. The listening regions correspond to different human listening positions and the distance between regions is larger than the largest distance between adjacent measurement positions within any region. Step S2 involves specifying a target impulse response for each of the L virtual sound sources at each of the M measurement positions in the spatially disjoint regions. Step S3 involves determining adjustable filter parameters of the audio precompensation controller so that a criterion function is optimized under the constraint of stability of the dynamics of the audio precompensation controller. The criterion function preferably includes a weighted summation of powers of differences between the compensated estimated impulse responses and the target impulse responses over a discrete grid of the M measurement positions.

In other words, a basic idea is to base the design on linear dynamic system models that describe the acoustic responses from each of the N loudspeakers to each of the M listening positions that are distributed among the P listening regions. In a second step, a target impulse response is also specified for each of the L virtual sound sources as perceived in each of the M listening positions. Preferably, the audio system controller is based on a linear dynamic precompensation filter that has the L virtual sound source input signals as inputs and produces input signals to the N audio channels of the sound reproduction system. In a third step the precompensation controller is adjusted with the aim of letting the series connection of compensator and system models approximate the target impulse responses. This is accomplished by adjusting the free parameters in the precompensation filter so that a criterion is optimized. This criterion is typically defined by a sum over all M listening positions of possibly frequency weighted powers of approximation errors.

In a particular exemplary embodiment, the optimal precompensation controller can be calculated by performing a Linear Quadratic Gaussian (LQG) optimization of the parameters of a stable, linear and causal multivariable feedforward servo filter, provided that a multivariable stochastic dynamic model is available that describes the assumed second order properties of the virtual sound sources.

In a subsequent optional step, the magnitude response of the resulting compensated system is equalized. This to some extent compensates for approximation errors in the previous step and also compensates undesired spectral coloring that may have been introduced in the target stage design. The result is one scalar equalizer filter for each of the virtual sound sources. These filters are placed in the signal chain before the precompensator. In summary, in the previous step—the design of the precompensation controller—a set of virtual loudspeakers in a virtual room is created which aims at replacing the physical loudspeakers and room acoustics. Each virtual loudspeaker may then be tuned inside the virtual room to a desired tonal characteristic.

The target stages may include parameters that are adjustable within prescribed limits. If so, the design can be iterated between adjustment of target stage parameters and adjustment of precompensator parameters, with the aim to attain an improved approximation between target stage and precompensated audio system, and thus an improved criterion value. Focusing the approximation accuracy on disjoint listening regions and allowing some variability in the target stages are both means for relaxing unnecessary constraints on the problem and thus attaining better approximation solutions.

The resulting precompensation filter may have elements with long impulse responses. If the computational complexity needs to be reduced, then it is proposed that scalar elements of the precompensation filter matrix are approximated by implementing these filters as a parallel connection of a finite impulse response (FIR) filter that corresponds to the initial part of the filter impulse response and an infinite impulse response (IIR) recursive filter that approximates the tail of the filter impulse response.

For a better understanding, the invention will now be described in more detail with reference to various exemplary embodiments. In the following, we will in Section 1 below provide a brief overview of the structure of an exemplary digital sound pre-compensation system. Section 2 then describes an example of the modelling and the target stage definition, while Section 3 defines an example of a particular optimization problem to be solved. Section 4 presents an exemplary design of a precompensation controller based on Linear Quadratic Gaussian (LQG) optimal feedforward control. Section 5 provides an exemplary technique to reduce the complexity of the resulting set of filters used by the precompensator and Section 6 discusses further implementation aspects of the design and the resulting audio precompensation system.

1. Sound Field Control By Linear Dynamic Precompensation

Linear filters, dynamic systems or models that may have multiple inputs and/or multiple outputs are represented by transfer function matrices in the following and are denoted by boldface letters. Transfer function matrices that include only FIR filters as elements will be denoted polynomial matrices and are denoted by italic capitals.

Figure 2:
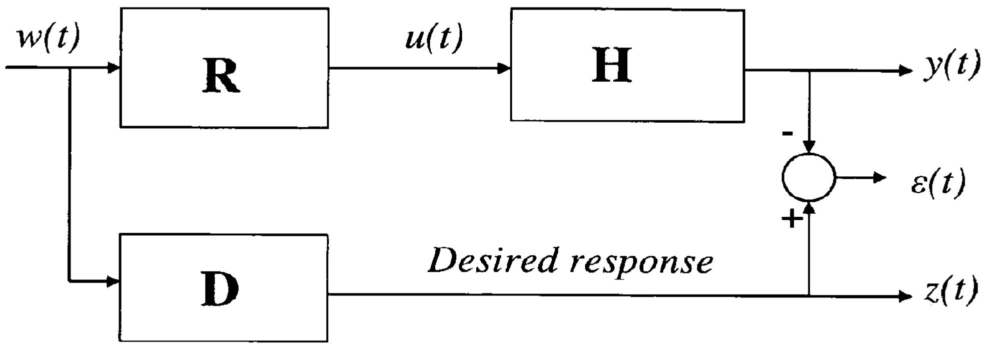
FIG. 2 describes the compensator R, as a dynamic system that as input signal has signal vector w(t) with L elements, that represents the input signals to the L virtual sound sources. The compensator produces a control signal u(t) with N elements, that acts as input to the stable linear dynamic model H of the acoustic system. The resulting acoustic signals at M measurement positions are represented by a column vector y(t). The desired dynamic system is specified by a stable $L \times M$ transfer function matrix D. Column j of the matrix D defines the target stage for component j of the vector w(t). When the signal vector w(t) is used as input to D, the resulting output is a desired signal vector z(t), with M elements. The difference y(t)-z(t) represents an error signal $\epsilon(t)$, which influences the criterion function that is adjusted in the proposed invention.

The sound generation or reproducing system to be modified will be represented as in FIG. 2 by a linear time-invariant and stable dynamic model H that describes the relation in discrete time between a set of N input signals u(t) to a set of M modeled output signals y(t):

$$y(t)=Hu(t)$$

$$y_m(t)=y(t)+e(t), \quad (1.1)$$

where t is an integer that represents a discrete time index (a unit sampling time is assumed) and the signal y(t) is a M-dimensional column vector representing the modeled sound time-series at the M measurement positions. The operator H represents a model of the acoustic impulse response, represented by a transfer function matrix. It is an M×N-matrix whose elements are stable linear dynamic operators or transforms, e.g. represented as FIR filters or IIR filters. These filters determine the response y(t) to a N-dimensional time-dependent input vector u(t). The transfer function matrix H represents the effect of the whole or a part of the sound generating or sound reproducing system, including any pre-existing digital compensators, digital-to-analog converters, analog amplifiers, loudspeakers, cables and the room acoustic response. In other words, the transfer function matrix H represents the dynamic response of relevant parts of a sound generating system.

The input signal u(t) to this system, which is a N-dimensional column vector, may represent input signals to N individual amplifier-loudspeaker chains of the sound generating system. The signal $y_m(t)$ (with subscript m denoting “measurement”) is a M-dimensional column vector representing the true (measured) sound time-series at the M measurement locations and e(t) represents noise, unmodelled room reflexes, effects of an incorrect model structure, nonlinear distortion and other unmodelled contributions.

The objective is to modify the dynamics of the sound generating system represented by (1.1) in relation to a reference dynamics. For this purpose, a reference matrix D of dynamic systems is introduced:

$$z(t)=Dw(t), \quad (1.2)$$

where w(t) is an L-dimensional vector representing a set of live or recorded sound sources or even artificially generated digital audio signals, including test signals used for designing the filter. The elements of the vector w(t) may, for example, represent channels of digitally recorded sound, or analog sources that have been sampled and digitized. In (1.2), D is a stable transfer function matrix of dimension M×L that is assumed to be known. This linear discrete-time dynamic system is to be specified by the designer. It represents the reference dynamics (desired target dynamics) of the vector y(t) in (1.1). In the compensated system, each element $w_i(t)$, i=1, . . . , L of w(t) will represent a virtual sound source. Its desired effect at the M measurement positions is represented by column i of the transfer function matrix D in (1.2). The desired responses for different listening regions are represented by filters in disjoint sets of rows of D. The system D may include a set of adjustable parameters. Alternatively, it may indirectly be affected by such a set via its specification.

The audio controller is assumed to be realized as a multivariable dynamic discrete-time precompensation filter, generally denoted by R, which generates an input signal vector u(t) to the audio reproduction system (1.1) based on linear dynamic processing of the signal w(t):

$$u(t)=Rw(t). \quad (1.3)$$

This audio precompensation controller includes a set of adjustable parameters. These parameters should allow sufficient flexibility to modify its input-output dynamic properties, for example allowing some elements of R or the whole of R to be zero for appropriate parameter settings. The optimization of R should however be constrained to parameter settings that make R an input-output stable dynamic system.

Our design objective will be to construct and stable transfer function matrix R of dimension N×L that is designed to generate an input signal vector u(t) to the audio reproduction system (1.1) such that its compensated model output y(t) approximates the reference vector z(t) well, according to a specified criterion. This objective would be attained if $$y(t)=Hu(t)=HRw(t)\approx z(t)=Dw(t). \quad (1.4)$$

The corresponding model-based approximation error at the M measurement positions is represented by $$\epsilon(t)=z(t)-y(t)=(D-HR)w(t). \quad (1.5)$$

The true, measured, error vector will then by (1.1) be $z(t)-y_m(t)=\epsilon(t)-e(t)$. The approximation (1.4) can never be made exact in practice with a limited number N of loudspeakers, a large number M of measurement positions partitioned in disjoint listening areas and complicated wide-band acoustic dynamic models, A scheme for calculating an appropriate approximation for the present problem is outlined in sections 3 and 4 below.

The attainable approximation quality depends on the nature of the problem set-up. For a fixed given acoustic environment, the quality of the approximation can in general be improved if the number of loudspeaker channels N is increased. It can likewise be improved by increasing the number M of measurement points within fixed listening regions, since this gives a denser sampling of the sound field. Enlargement of the listening regions or addition of regions for a fixed N would, in general, result in larger approximation errors. Adding more sound stages (increasing L) would result in the need for proportionally more compensation filters, but it would not decrease the attainable approximation accuracy for previously designed sound stages if other basic parameters were kept constants. If the elements of w(t) are assumed uncorrelated then by linearity, the optimal precompensation filters presented in Section 4 below can be computed separately for different sound stages and their individual contributions to the total approximation error will be additive.

Linear discrete-time dynamic systems are in the following represented using the discrete-time backward shift operator here denoted by $q^{-1}$. A signal vector s(t) is shifted backward by one sample by this operator: $q^{-1}s(t)=s(t-1)$. The backward shift operator corresponds to the complex variable $z^{-1}$ or $e^{-j\omega}$ in the discrete-time frequency domain. Likewise, the forward shift operator is denoted q, so that qs(t)=s(t+1). It corresponds to the complex variable z or $e^{j\omega}$ in the frequency domain. A causal matrix of FIR filters (polynomial matrix) $A(q^{-1})$ operates only on input signals that are current or past with respect to the present time index t. It will thus have matrix elements that are polynomials in the backward shift operator $q^{-1}$ only.

2. Acoustic Modelling and Target Stage Definition

The room-acoustic impulse responses of each loudspeaker at each listener position are estimated from measurements at M positions, which are partitioned into several spatially separated listening areas. It is recommended that at least four measurement positions are used within each listening area, to obtain adequate fidelity within extended spatial volumes, since listeners are expected to move their heads within prescribed areas. The measurement positions within a listening area can, for example, be located in a plane or be distributed within a 3D volume. The dynamic acoustic responses can then be estimated by sending out test signals from the loudspeakers, one loudspeaker at a time, and recording the resulting acoustic signals at all M listening positions. White or colored noise may be used as test signals for this purpose. Models of the linear dynamic responses from one loudspeaker to M outputs can then be estimated in the form of FIR or IIR filters with one input and M outputs. Various system identification techniques such as the least squares method or spectral analysis-based techniques can be used for this purpose. The measurement procedure is repeated for all loudspeakers, finally resulting in a model H that is represented by a M×N matrix of dynamic models. The multi input—multi output model may alternatively be represented by a state space description.

Figure 3:
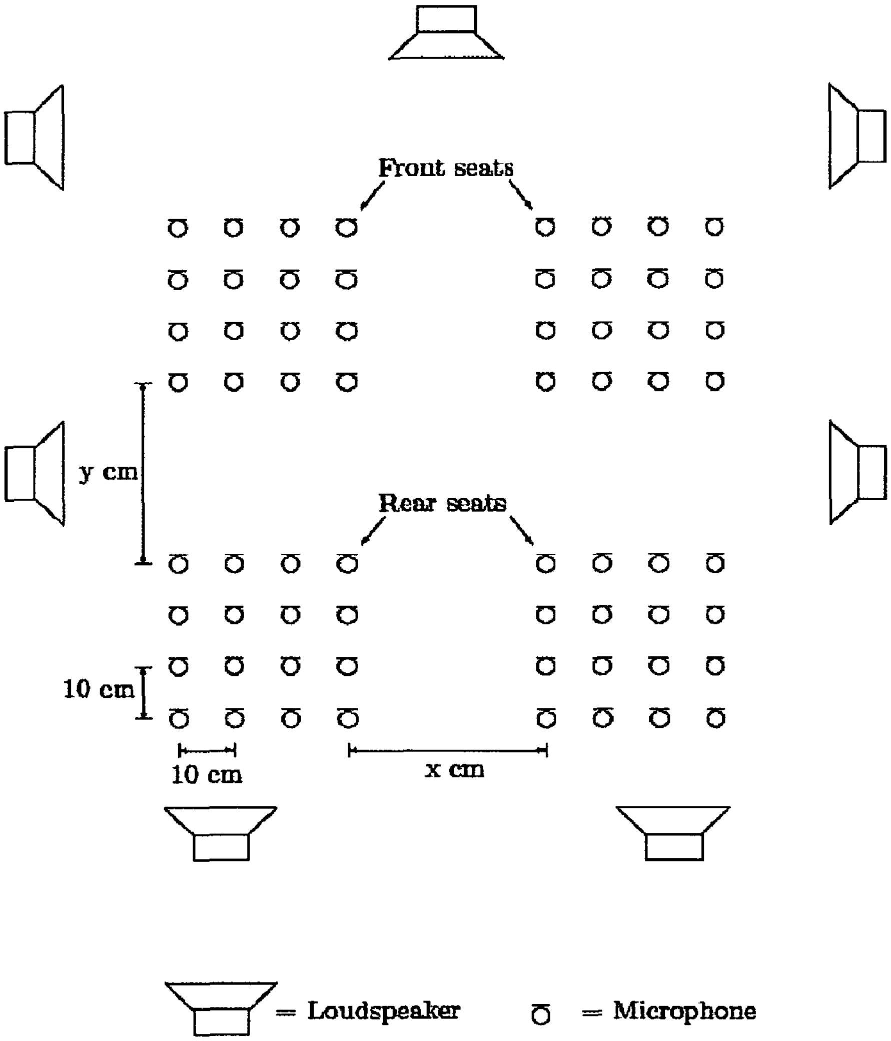
FIG. 3 describes an example where M=64 measurement positions are located inside a car compartment, with subsets of 16 positions each are located in four disjoint regions in the horizontal plane. The four regions are centered at head positions in the left and right front seats and in the left and right rear seats, respectively. The distance x between listening regions is larger than the smallest distance (here 10 cm) between adjacent measurement positions.

In a car audio example illustrated by FIG. 3, M=64 measurement positions are used. The design focuses on P=4 separate listener regions at head heights each centered at a car seat (front left, front right, rear left, rear right). At each seat, a quadratic horizontal grid of 4×4 measurement positions is employed, resulting in two sets of measurements for each input channel (loudspeaker). In general, with P listening regions, $$y_m(t) = \begin{pmatrix} y_{m1}(t) \\ \vdots \\ y_{mP}(t) \end{pmatrix} = \begin{pmatrix} H_1(q^{-1}) \\ \vdots \\ H_p(q^{-1}) \end{pmatrix} u(t) + e(t) = H(q^{-1})u(t) + e(t). \tag{2.1}$$

Here, the sub-vectors of measurements $y_m i(t)$, i=1, . . . 4, would each have 16 elements in the example of FIG. 3 and the control signal u(t) would have N=7 elements. The resulting set of M×N measurements can be used to estimate the set of M×N impulse responses that define the model in (1.1) and (2.1). In the example of FIG. 3, the sub-models $H_i(q^{-1})$ for each listening region would be matrices of 16×7=112 transfer functions each, while the total model $H(q^{-1})$ would consist of 64×7=448 transfer functions.

A target stage is composed of M desired impulse responses (or equivalently, transfer functions) that are preferably non-zero, one for each measurement position. One target stage is defined for each of L virtual sources that are to be created and it is represented by a column of the matrix D in (1.2). For example, in the case of reproducing stereo material via two virtual loudspeakers, the vector w(t) would have two elements and two target stages would be defined.

The target stages can be measured inside a reference listening room using the same technique as when modeling the acoustic impulse response, or the target stages can be simulated. The target stages may be defined so that all the P listening areas are located in a "sweet-spot" of the virtual listening environment.

If the target stages are obtained by computing acoustic impulse responses from a simulated acoustic environment, then some controlled variability can be introduces into the target stages. For example, the angles and distances of the virtual loudspeakers, the size of the room and properties such as strength and diffuseness of first reflexes can be left adjustable within prescribed limits. Such flexibility of the target can help attain better approximation to the selected targets, better criterion values and better perceived audio quality. This type of flexibility can be utilized by adjusting the parameters of the stage D and the parameters of the precompensation filter R iteratively:

A precompensator is first optimized for an initial set of target stage parameters. The target stage parameters are then adjusted within prescribed admissible limits, a new stage D is defined and the precompensator is optimized again for the new target stage parameters. The resulting criterion value is then evaluated. This procedure is repeated until no improvement of the criterion value can be found.

The search of the target stage parameter space can be performed by a search routine such as a gradient-based or a conjugated gradient optimization method, by the Simplex method or by genetic algorithms. If the number of adjustable stage parameters is not too large, an exhaustive search of grid points for a discrete grid of target stage parameter values is feasible.

3. Optimization Criterion

To obtain analytical techniques for adjusting the precompensation filter, it is convenient to define a scalar criterion that is to be optimized. An example of an appropriate criterion contains a weighted sum of the powers of the approximation errors $\epsilon_i(t)$ at all measurement points i=1, . . . , M and adds optional penalty terms on the powers of loudspeaker input signals $u_j(t)$, j=1, . . . , N, resulting in a quadratic criterion of the form $$J = \sum_{i=1}^{M} E|V_i(q^{-1})\varepsilon_i(t)|^2 + \sum_{j=1}^{M} E|W_j(q^{-1})u_j(t)|^2 \tag{3.1a}$$

$$= E\{(V(q^{-1})\varepsilon(t))' V(q^{-1})\varepsilon(t) + (W(q^{-1})u(t))' W(q^{-1})u(t)\} \tag{3.1b}$$

$$= \|V(D-HR)w(t)\|_2^2 + \|WRw(t)\|_2^2. \tag{3.1c}$$

The vector $\epsilon(t)$ of errors at the measurement positions is related to the vector w(t) via (1.5). The expectation E( ) in (3.1) is to be taken with respect to the statistical properties of the signal w(t), and any other parts of the model structure that are described statistically. The expression $\|\bullet\|_2^2$ in (3.1c) represents the squared 2-norm of a random process. The weighting $V(q^{-1})=\mathrm{diag}[V_i(q^{-1})]$ in (3.1b) is defined to be a square diagonal polynomial matrix of full rank M. It may thus contain scalar FIR filters $V_i(q^{-1})$ as diagonal elements. These filters can be used to perform frequency-dependent weighting of the components of the error vector before summation. Likewise, $W(q^{-1})=\mathrm{diag}[W_i(q^{-1})]$. Then noting that ( )' denoted transpose and that both right-hand terms in (3.1b) represent scalar multiplications of vectors, it is evident that the expression (3.1 a) equals the expression (3.1b). The expression (3.1c) is seen to equal to (3.1b) by definition, using (1.5) and (1.3).

it is evident that the first right-hand sum of this criterion represents a weighted summation over the M measurement positions of powers of differences between the compensated estimated impulse responses represented by elements of HR and the target impulse responses represented by elements of D, where the weighting is performed by the polynomial matrix $V(q^{-1})$ and by the spectral properties of the signal w(t). Equal weighting of all components of the error vector $\epsilon(t)$ would be obtained if a unit matrix $V(q^{-1})=I$ is used and if all the elements of w(t) are assumed to be white and mutually uncorrelated.

The square diagonal polynomial matrix $W(q^{-1})=\mathrm{diag}[W_j(q^{-1})]$ can, for example, to be used to focus the control energy into frequency ranges that are appropriate for particular loudspeaker inputs. Each penalty FIR filter is then given low gain within the operating range of the loudspeaker j and high gain outside of that range.

4. Optimal Controller Design

The criterion (3.1) or other forms of quadratic criteria could be optimized by various means. One could place structural constraints on the dynamic elements of the controller matrix R, such as requiring them to be FIR filters of specified degrees, and then perform an optimization of the precompensation filter parameters under these constraints, by e.g. adaptive filtering or FIR Wiener filter design techniques. However, the arbitrary introduction of structural constraints would always limit the performance. The optimization should preferably be performed without structural constraints on the precompensation matrix, except for the necessary constraints of causality and stability of its dynamics. Under the above stated problem formulation, the precompensation controller design problem then becomes a Linear-Quadratic Gaussian design problem for a multivariable feedforward control element R.

Linear quadratic theory provides optimal linear controllers for linear systems and quadratic criteria [13],[14]. If the problem formulation is such that signals are assumed to have Gaussian statistics, then this solution can be shown to be optimal also within the class of all (linear as well as nonlinear) controllers. The optimization is performed under the constraint of causality of the controller and stability of the controlled system. In the feedforward control setting discussed here, with the systems H and D assumed stable, stability of the controlled system D-HR is equivalent to stability of the controller R.

We will below present the Linear Quadratic Gaussian optimal feedforward controller for the problem defined by the relations (1.1)-(1.5) and the criterion (3.1) above. The solution is presented in transfer function form, using a technique based on polynomial matrices [15][16]. The optimality of this solution for a more general problem formulation, that includes the present one as a special case, has been proved in section 3.3 of [16]. Alternatively, a state-space formulation based on solving algebraic Riccati equations could be used [13],[14].

4.1 Polynomial Design Equations for Optimizing the Precompensation Controllers Let the model (1.1) be parameterized by polynomial matrices $$y(t)=Hu(t)=B(q^{-1})A^{-1}(q^{-1})u(t). \tag{4.1}$$

This corresponds to first performing the stable recursive filtering $A(q^{-1})u_1(t)=u(t)$ using a square polynomial matrix $A(q^{-1})$ and using the resulting signal vector $u_1(t)$ of dimension N as input to a multivariable FIR filter $y(t)=B(q^{-1})u_1(t)$ that produces y(t) as output signal. The dynamics of the stable and causal transfer function matrix H is thereby parameterized by the two causal polynomial matrices $A(q^{-1})$ and $B(q^{-1})$ in a so-called right matrix fraction description. In the special case when a multivariable FIR model is used, then $A(q^{-1})=I$ is used, and so $H=B(q^{-1})$.

The reference dynamics (1.2) is here assumed to be defined by a multivariable FIR matrix $D(q^{-1})$ and a common delay of d samples:

$$z(t)=Dw(t)=D(q^{-1})q^{-d}w(t)=D(q^{-1})w(t-d). \tag{4.2}$$

Individual propagation delays that are parts of the stage models are assumed to be included in $D(q^{-1})$, by setting initial coefficients of corresponding FIR filters to zero. The common bulk delay d is a design variable. By increasing it from zero, better approximation fidelity is obtained, but at some point, further increases of d would give diminishing returns in terms of reducing the criterion value. In problems where real-time aspects such as e.g. synchronization of video signals to related audio signals are relevant, such aspects may place an upper limit on admissible bulk delays.

Furthermore, assume that a model of the second order statistical properties of the signal vector w(t) is given in terms of a stable multivariate autoregressive model $$H(q^{-1})w(t)=v(t), \tag{4.3}$$

where the white noise vector v(t) of dimension L is assumed to be Gaussian, to have zero mean and to have a unit matrix as covariance matrix. The polynomial matrix $H(q^{-1})$ has dimension L×L.

Finally assume that there exists a causal N×N polynomial matrix $\beta(q^{-1})$ with stable inverse that satisfies the spectral factorization equation $$\beta_*\beta=B_*V_*VB+A_*W_*WA, \tag{4.4}$$

where we have not written out the shift operator arguments for simplicity and where the notation $B_*=B'(q)$ represents a reciprocal polynomial matrix, where the forward shift operator has been substituted for the backward shift operator and the polynomial matrix has been transposed [15],[16]. Such a so-called stable right spectral factor exists for the present problem under mild conditions; see section 3.3 of [16]. Under this assumption, a stable and causal linear feedforward controller (1.3), that minimizes the criterion (3.1) for a dynamic system described by the models (4.1),(4.2) and (4.3), is given by $$u(t)=Rw(t)=A(q^{-1})\beta^{-1}(q^{-1})Q(q^{-1})w(t), \tag{4.5}$$

where the causal N×L polynomial matrix $Q(q^{-1})$ is, together with a noncausal N×L polynomial matrix $L_*(q)$, the unique solution to the linear polynomial matrix equation (Diophantine equation)

$$q^{-d}B_*V_*VD=\beta_*Q+qL_*H. \tag{4.6}$$

See Section 3.3 of [16] for a proof of the optimality and the uniqueness of this solution. The optimization of the criterion (3.1) is thus performed by first solving the quadratic polynomial matrix right spectral factorization equation (4.4) to obtain the polynomial matrix, $\beta(q^{-1})$ and then solving the Diophantine equation (4.6) to obtain the polynomial matrix $Q(q^{-1})$.

The regulator (4.5) is then represented by a structure which could be realized as a series connection of three multivariable filters as follows. The signal vector w(t) of dimension L is used as input to a FIR filter matrix $Q(q^{-1})$ of dimension N×L to obtain an intermediate signal vector $f(t)=Q(q^{-1})w(t)$ of dimension N. This signal is used as input to a filter block that performs a vector recursive filtering $\beta(q^{-1})g(t)=f(t)$ to produce a second intermediate signal vector g(t) of dimension N, based on f(t) and on previous samples of g(t). Finally, this signal vector g(t) is used as input to a FIR filter $u(t)=A(q^{-1})g(t)$ that as its output produces the control signal u(t). This last step inverts the autoregressive dynamics of the model (4.1) that is represented by the factor $A^{-1}(q^{-1})$ on the input side of equation (4.1). Because of the recursion that involves the right spectral factor matrix, the controller (4.5) is in the form of a recursive infinite impulse response filter with multiple inputs and multiple outputs. An approximation of the matrix elements of this controller, that uses a set of scalar filters of lower orders, is discussed in Section 5 below.

When the elements of w(t) are assumed uncorrelated, by assuming $H(q^{-1})$ in (4.4) to be a diagonal polynomial matrix, then energy errors and criterion value contributions arising from different source signals will be additive. The solution for the problem for L virtual sources can then be obtained by calculating a precompensation controller vector of dimension N×1 for each source by (4.6) and then forming the total N×L matrix R by using these individual vectors as its columns.

An optimization of the precompensation controller as exemplified here is designed to jointly perform equalization of the original room acoustics and loudspeaker dynamics, crossover filter design and delay and level calibration, sum response optimization and up-mixing of L sources to N loudspeaker inputs to approximate the prescribed sound field response (4.2) according to the criterion (3.1).

However, the prescribed sound field may itself have introduced some undesired spectral features. An optional post-processing step can be used to handle such remaining issues.

4.2. Post-Processing for Spectral Smoothness

Consider a case where the target stage is specified by using a simulator that creates plane wave impulse responses. If the target stage consists of only direct sound, then the resulting target frequency response is flat. If in addition to the direct wave the target stage also includes reflections, spectral coloration will arise. Moreover, the designed controller matrix R inevitably will have remaining approximation errors since the number of measurement positions is typically much larger than the number of loudspeakers. These approximation errors may have different magnitude at different frequencies. Magnitude response imperfections are generally undesirable and the controller matrix should preferably be adjusted so that an overall target magnitude response is reached on average in all the listening regions.

A final design step is therefore preferably added after the criterion minimization with the aim of adjusting the controller response so that, on average, a target average magnitude response for each virtual source is well approximated in all the listening regions. Hence, the magnitude responses of the overall system (including the filters) are evaluated in the various listening positions, based on the design models or based on new measurements. A minimum phase filter is then designed so that on average (in the RMS sense) the target magnitude response is reached in all listening regions. As an example, variable fractional octave smoothing based on the spatial response variations may be employed in order not to overcompensate in any particular frequency region. The result is one scalar equalizer filter for each of the virtual sound sources. These filters are placed in the signal chain between the elements of w(t) and the inputs to the precompensator that was designed in the previous step.

4.3 Illustrative Example

The performance of the proposed sound control technique is illustrated by measured results obtained in a car equipped with one tweeter in the center of the dashboard, four mid-range +tweeter pairs in the front and rear doors, four low-range woofers (working range roughly 15-5000 Hz) in the front and rear doors, and a pair of subwoofer speakers (working range roughly 15-300 Hz) in the rear shelf. The subwoofers are driven by the same signal source and are thus treated as one single subwoofer. Thus, N=10 loudspeaker input channels are used in this setting. This is a rather representative premium car sound system. At head height at the two front seat positions, a model was estimated for 16 measurement positions at each seat, for horizontal square listening regions of dimension 30×30 cm with 10 cm distance between measurement points, as illustrated by the front seat part of FIG. 3. A model with M×N=32×10 individual impulse responses was then estimated. Based on this model and various experimental target stages, precompensation controllers were calculated and their performance was evaluated on the estimated model. All results were obtained using 10 FIR filters per single target stage, each of length 10 000 coefficients using 44.1 kHz sampling.

Figure 4:
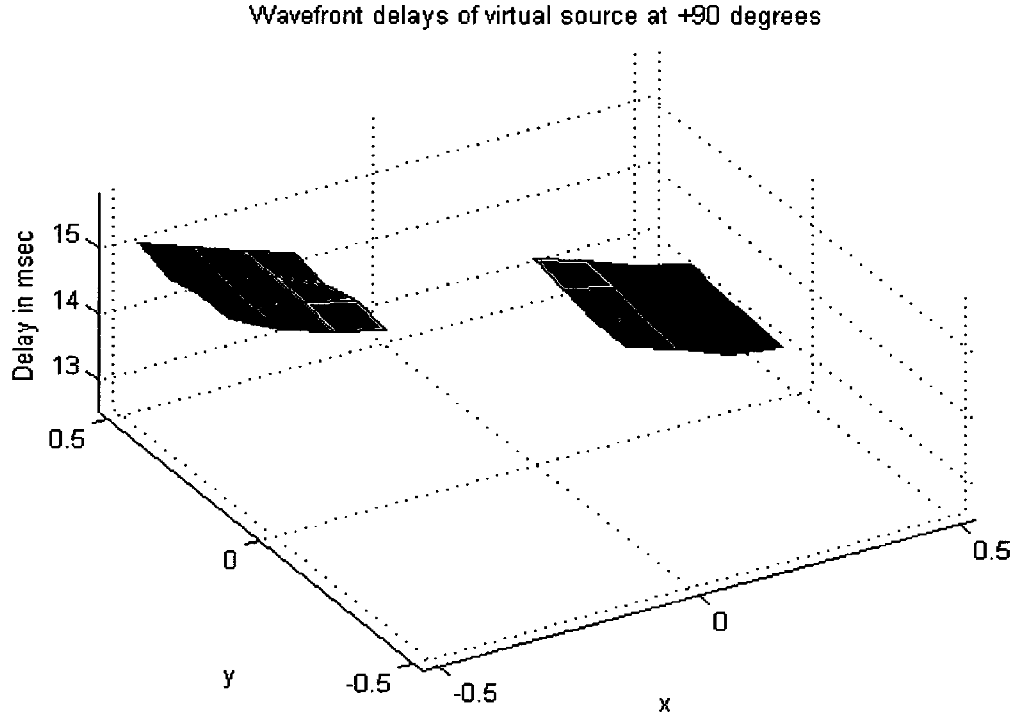
FIG. 4 shows the delays, measured in samples, as functions of position in all M=32 measurement locations for a single virtual source placed at angle +90 degrees to the right relative to the front, that generates plane broadband waves.

We here present results for a single plane-wave virtual source as a single target stage and judge various measured performance attributes. FIG. 4 shows the measured delays at each measurement position for a virtual source placed at 90 degrees to the right relative to the front direction. None of the physical loudspeakers is positioned in this direction. Only minor errors occur; the delay surfaces show a clear tilt towards the intended direction. Possible sources of error include delay estimation errors and inadequate sound field reconstruction. On the whole, the algorithm reproduces sound waves from the desired directions in both front seat listening regions.

Figure 5:
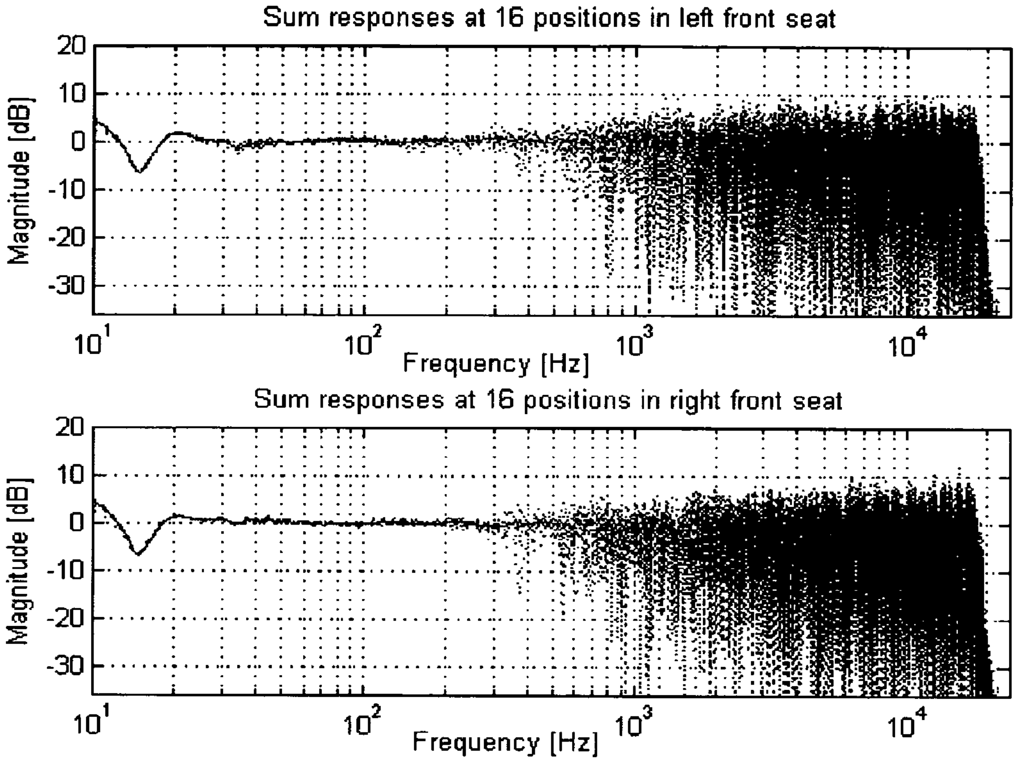
FIG. 5. Magnitude responses in the 16 measurement positions of the left front seat and the 16 measurement positions of the right front seat for a virtual source positioned at −35 degrees relative to the front.

FIG. 5 shows the resulting power responses from 16 different positions in the left front seat and 16 positions at the right front seat respectively, for a virtual left front speaker, located at −35 degrees in the plane of the microphones and with a flat target magnitude response. The red solid curves show magnitudes of the averages over 16 measurement positions of the complex gains of the compensated models at those positions, while the dotted blue curves show individual magnitude responses. The algorithm has evidently evened out the average spectral responses over space by a proper combined use of the 10 loudspeakers. For individual loudspeakers, there are significant differences in the uncompensated measured responses at the different listening positions. In the precompensated model shown in FIG. 5, the magnitudes in the individual listening positions are very close at frequencies up to 300 Hz. At higher frequencies, the distance between the microphones (10 cm) becomes on the order of or larger than the wavelength. An exact control of the received phase at each position in the higher frequency regions is therefore not possible, and it is fortunately not necessary from a psychoacoustic perspective. The average response is of most importance for human perception at higher frequencies, and the averages over 16 positions follow the flat target response within 5 dB over the whole audible frequency range.

5. Filter Implementation

The resulting matrix filter R by (4.x) can be realized in any number of ways, in state space form or in transfer function form. The required filters are in general of very high order, in particular if a full audio range sampling rate is used and if also room acoustic dynamics needs to be taken into account. To obtain a computationally feasible design, methods for limiting the computational complexity of the precompensator are of interest.

We here outline one method for this purpose that is based on controller order reduction of elements of the controller matrix R, in particular of any transfer functions that have impulse responses with very long but smooth tails. The method works as follows.

The relevant scalar impulse response elements $R_{ij}(q^{-1})$ of the pre-compensator R are first represented as very long FIR filters.

For each precompensator impulse response $R_{ij}(q^{-1})$,

1. Determine a lag $t_1>1$ after which the impulse response has a smooth shape and a second lag $t_2>t_1$ after which the impulse response is negligible.
2. Use a model reduction or system identification technique to adjust a low order recursive IIR filter to approximate the FIR filter tail for a delay interval $[t_1, t_2]$
3. Realize the approximated scalar precompensator filter as a parallel connection $R_{ij}(q^{-1})\approx M(q^{-1})+q^{t1}N(q^{1})$, where $M(q^{-1})$ is a FIR filter that equals the first $t_1$ impulse response coefficients of the original FIR filter $R_{ij}(q^{-1})$, from lag zero to lag $t_1-1$, while $N(q^{-1})$ is the IIR filter that approximates it tail.

The aim of this procedure is to obtain realizations in which the sum of the number of parameters in the FIR filter $M(q^{-1})$ and the IIR filter $N(q^{-1})$ is much lower than the original number of impulse response coefficients. Various different methods for approximating the tail of the impulse response can be used, for example adjustment of autoregressive models to a covariance sequence based on the Yule-Walker equations.

To obtain low numerical sensitivity to rounding errors of coefficients when implementing the resulting IIR filters with finite precision arithmetic, it is preferable to implement them as parallel connections or series connections of lower order filters. As an example, first order filters or second order IIR filter elements (so-called biquadratic filters) may be used.

6. Implementational Aspects

Typically, the design equations are solved on a separate computer system to produce the filter parameters of the pre-compensation filter. The calculated filter parameters are then normally downloaded to a digital filter, for example realized by a digital signal processing system or similar computer system, which executes the actual filtering.

Although the invention can be implemented in software, hardware, firmware or any combination thereof, the filter design scheme proposed by the invention is preferably implemented as software in the form of program modules, functions or equivalent. The software may be written in any type of computer language, such as C, C++ or even specialized languages for digital signal processors (DSPs). In practice, the relevant steps, functions and actions of the invention are mapped into a computer program, which when being executed by the computer system effectuates the calculations associated with the design of the precompensation filter. In the case of a PC-based system, the computer program used for the design of the audio precompensation filter is normally encoded on a computer-readable medium such as a DVD, CD or similar structure for distribution to the user/filter designer, who then may load the program into his/her computer system for subsequent execution. The software may even be downloaded from a remote server via the Internet.

Figure 6:
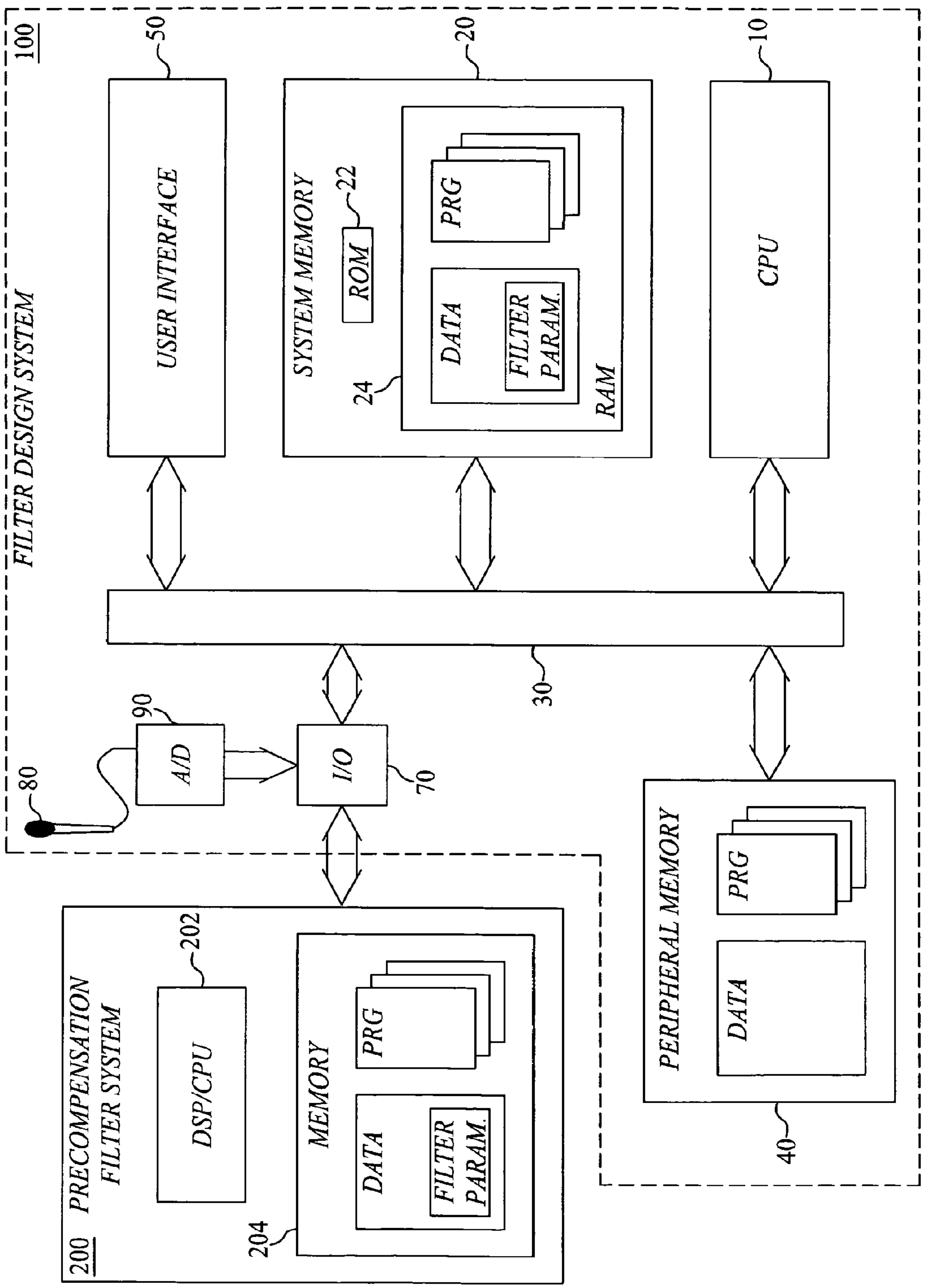
FIG. 6 is a schematic block diagram of an example of computer-based system suitable for implementation of the invention.

FIG. 6 is a schematic block diagram illustrating an example of a computer system suitable for implementation of a filter design algorithm according to the invention. The system 100 may be realized in the form of any conventional computer system, including personal computers (PCs), mainframe computers, multiprocessor systems, network PCs, digital signal processors (DSPs), and the like. Anyway, the system 100 basically comprises a central processing unit (CPU) or digital signal processor (DSP) core 10, a system memory 20 and a system bus 30 that interconnects the various system components. The system memory 20 typically includes a read only memory (ROM) 22 and a random access memory (RAM) 24. Furthermore, the system 100 normally comprises one or more driver-controlled peripheral memory devices 40, such as hard disks, magnetic disks, optical disks, floppy disks, digital video disks or memory cards, providing non-volatile storage of data and program information. Each peripheral memory device 40 is normally associated with a memory drive for controlling the memory device as well as a drive interface (not illustrated) for connecting the memory device 40 to the system bus 30. A filter design program implementing a design algorithm according to the invention, possibly together with other relevant program modules, may be stored in the peripheral memory 40 and loaded into the RAM 22 of the system memory 20 for execution by the CPU 10. Given the relevant input data, such as a model representation and other optional configurations, the filter design program calculates the filter parameters of the precompensation filter.

The determined filter parameters are then normally transferred from the RAM 24 in the system memory 20 via an I/O interface 70 of the system 100 to a precompensation filter system 200. Preferably, the precompensation filter system 200 is based on a digital signal processor (DSP) or similar central processing unit (CPU) 202, and one or more memory modules 204 for holding the filter parameters and the required delayed signal samples. The memory 204 normally also includes a filtering program, which when executed by the processor 202, performs the actual filtering based on the filter parameters.

Instead of transferring the calculated filter parameters directly to a precompensation filter system 200 via the I/O system 70, the filter parameters may be stored on a peripheral memory card or memory disk 40 for later distribution to a precompensation filter system, which may or may not be remotely located from the filter design system 100. The calculated filter parameters may also be downloaded from a remote location, e.g. via the Internet, and then preferably in encrypted form.

In order to enable measurements of sound produced by the audio equipment under consideration, any conventional microphone unit(s) or similar recording equipment 80 may be connected to the computer system 100, typically via an analog-to-digital (A/D) converter 80. Based on measurements of (conventional) audio test signals made by the microphone 80 unit, the system 100 can develop a model of the audio system, using an application program loaded into the system memory 20. The measurements may also be used to evaluate the performance of the combined system of precompensation filter and audio equipment. If the designer is not satisfied with the resulting design, he may initiate a new optimization of the precompensation filter based on a modified set of design parameters.

Furthermore, the system 100 typically has a user interface 50 for allowing user-interaction with the filter designer. Several different user-interaction scenarios are possible.

For example, the filter designer may decide that he/she wants to use a specific, customized set of design parameters in the calculation of the filter parameters of the filter system 200. The filter designer then defines the relevant design parameters via the user interface 50.

It is also possible for the filter designer to select between a set of different pre-configured parameters, which may have been designed for different audio systems, listening environments and/or for the purpose of introducing special characteristics into the resulting sound. In such a case, the preconfigured options are normally stored in the peripheral memory 40 and loaded into the system memory during execution of the filter design program.

The filter designer may also define the reference system by using the user interface 50. In particular, the bulk delay d of the reference system may be selected by the user, or provided as a default delay. Instead of determining a system model based on microphone measurements, it is also possible for the filter designer to select a model of the audio system from a set of different preconfigured system models. Preferably, such a selection is based on the particular audio equipment with which the resulting precompensation filter is to be used.

Preferably, the audio filter is embodied together with the sound generating system so as to enable generation of sound influenced by the filter.

In an alternative implementation, the filter design is performed more or less autonomously with no or only marginal user participation. An example of such a construction will now be described. The exemplary system comprises a supervisory program, system identification software and filter design software. Preferably, the supervisory program first generates test signals and measures the resulting acoustic response of the audio system. Based on the test signals and the obtained measurements, the system identification software determines a model of the audio system. The supervisory program then gathers and/or generates the required design parameters and forwards these design parameters to the filter design program, which calculates the precompensation filter parameters. The supervisory program may then, as an option, evaluate the performance of the resulting design on the measured signal and, if necessary, order the filter design program to determine a new set of filter parameters based on a modified set of design parameters. This procedure may be repeated until a satisfactory result is obtained. Then, the final set of filter parameters are downloaded/implemented into the precompensation filter system.

It is also possible to adjust the filter parameters of the precompensation filter adaptively, instead of using a fixed set of filter parameters. During the use of the filter in an audio system, the audio conditions may change. For example, the position of the loudspeakers and/or objects such as furniture in the listening environment may change, which in turn may affect the room acoustics, and/or some equipment in the audio system may be exchanged by some other equipment leading to different characteristics of the overall audio system. In such a case, continuous or intermittent measurements of the sound from the audio system in one or several positions in the listening environment may be performed by one or more microphone units or similar sound recording equipment. The recorded sound data may then be fed into a filter design system, such as system 100 of FIG. 6, which calculates a new audio system model and adjusts the filter parameters so that they are better adapted for the new audio conditions.

Naturally, the invention is not limited to the arrangement of FIG. 6. As an alternative, the design of the precompensation filter and the actual implementation of the filter may both be performed in one and the same computer system 100 or 200. This generally means that the filter design program and the filtering program are implemented and executed on the same DSP or microprocessor system.

Figure 7:
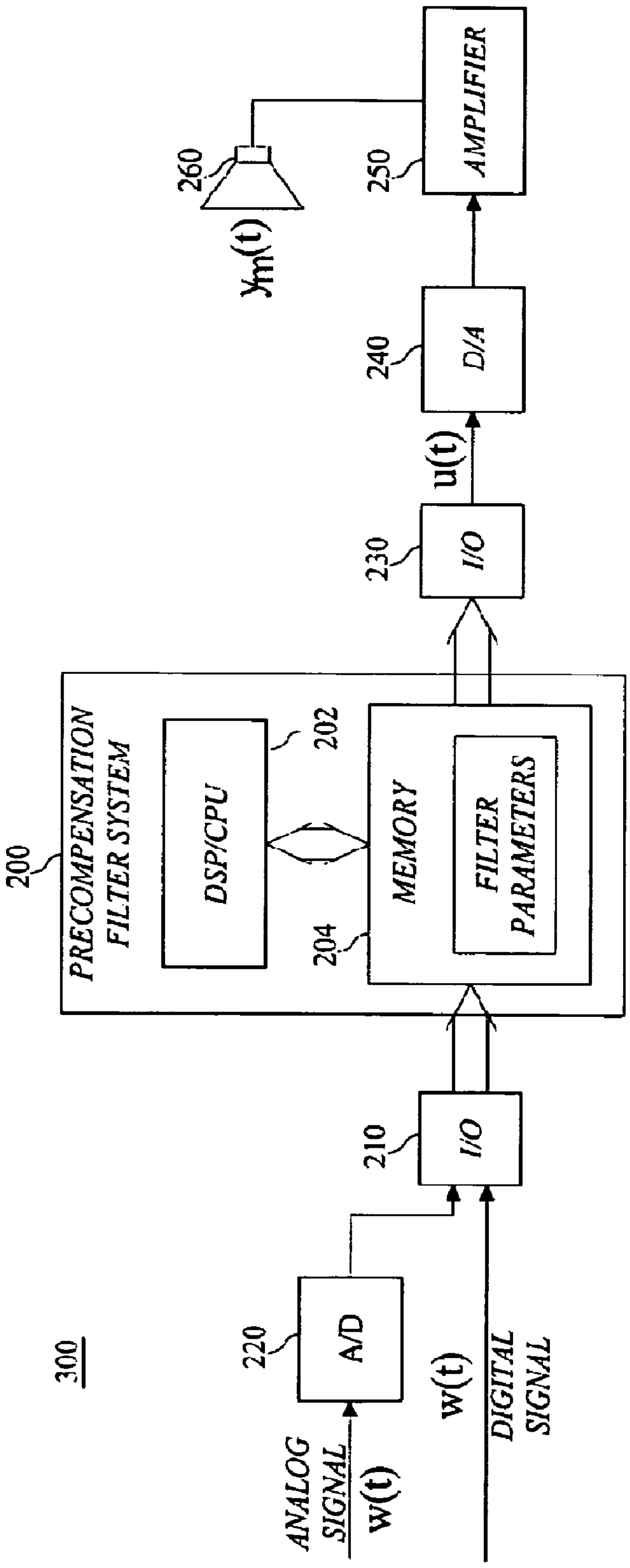
FIG. 7 illustrates an exemplary audio system incorporating a precompensation filter configured according to the design method of the invention.

A sound generating or reproducing system 300 incorporating a precompensation filter system 200 according to the present invention is schematically illustrated in FIG. 7. A vector w(t) of audio signals from a sound source is forwarded to a precompensation filter system 200, possibly via a conventional I/O interface 210. If the audio signals w(t) are analog, such as for LPs, analog audio cassette tapes and other analog sound sources, the signal is first digitized in an A/D converter 210 before entering the filter 200. Digital audio signals from e.g. CDs, DAT tapes, DVDs, mini discs, and so forth may be forwarded directly to the filter 200 without any conversion.

The digital or digitized input signal w(t) is then precompensated by the precompensation filter 200, basically to take the effects of the subsequent audio system equipment into account.

The resulting compensated signal u(t) is then forwarded, possibly through a further I/O unit 230, for example via a wireless link, to a D/A-converter 240, in which the digital compensated signal u(t) is converted to a corresponding analog signal. This analog signal then enters an amplifier 250 and a loudspeaker 260. The sound signal $y_m(t)$ emanating from the set of N loudspeaker 260 then has the desired audio characteristics, giving a close to ideal sound experience. This means that any unwanted effects of the audio system equipment have been eliminated through the inverting action of the precompensation filter.

The precompensation filter system may be realized as a standalone equipment in a digital signal processor or computer that has an analog or digital interface to the subsequent amplifiers, as mentioned above. Alternatively, it may be integrated into the construction of a digital preamplifier, a computer sound card, a compact stereo system, a home cinema system, a computer game console, a TV, an MP3 player docking station or any other device or system aimed at producing sound. It is also possible to realize the precompensation filter in a more hardware-oriented manner, with customized computational hardware structures, such as FPGAs or ASICs.

It should be understood that the precompensation may be performed separate from the distribution of the sound signal to the actual place of reproduction. The precompensation signal generated by the precompensation filter does not necessarily have to be distributed immediately to and in direct connection with the sound generating system, but may be recorded on a separate medium for later distribution to the sound generating system. The compensation signal u(t) in FIG. 1 could then represent for example recorded music on a CD or DVD disk that has been adjusted to a particular audio equipment and listening environment. It can also be a precompensated audio file stored on an Internet server for allowing subsequent downloading of the file to a remote location over the Internet.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

REFERENCES

[1] S. Spors, R. Rabenstein and J. Ahrens, "The theory of wave field synthesis revisited", Presented at *AES 124th Convention*, Amsterdam, preprint 7358, May 2008.

[2] M. A. Poletti, "Three-dimensional surround sound systems based on spherical harmonics", *J. Audio Eng. Soc.*, vol.53, no. 11, pp. 1004-1025, November 2005.

[3] A. Laboire, R. Bruno, and S. Montoya, "Reproducing multichannel sound on any speaker layout", *Audio Engineering Society AES* 112$^{th}$ *Convention*, Barcelona, Spain, May 28-31 2005, paper 6375.
[4] M. A. Poletti, "An investigation of 2D multizone surround sound systems", *Audio Engineering Society AES* 125$^{th}$ *Convention*, San Francisco, Oct. 2-5 2008, Convention paper 7551.
[5] S. J. Elliott and P. A. Nelson, "Multiple-point equalization in a room using adaptive digital filters", *J. Audio Eng. Soc.*, vol. 37, no. 11, pp. 899-907, November 1989.
[6] U.S. Pat No. 5,862,227
[7] U.S. Pat No. 5,910,990
[8] U.S. Pat No. 5,727,066
[9] U.S. Pat. No. 5,949,894
[10] International Patent Application WO 94/24835
[11] O. Kirkeby, P. A. Nelson, H. Hamada and F. Orduna-Bustamante, "Fast deconvolution of multichannel systems using regularization", *IEEE Transactions on Speech and Audio Processing*, vol. 6 no. 2, pp. 189-194, March 1998.
[12] U.S. Pat. No. 7,215,787.
[13] H. Kwakernaak and R. Sivan, *Linear Optimal Control Systems*. Wiley, New York, 1972.
[14] B. D. O Anderson and J. B. Moore, *Optimal Control, Linear Quadratic Methods*. Prentice-Hall International, London, 1989.
[15] V. Kučera, *Analysis and Design of Linear Control Systems*, Academia Prague, and Prentice-Hall International, London, 1989.
[16] M. Sternad and A. Ahlen, "LQ controller design and self-tuning control", Sections 3.1-3.3 in *Polynomial Methods in Optimal Control and Filtering*, K. Hunt ed., pp. 56-66, Peter Peregrinus, London, 1993.

The invention claimed is:

1. A method for determining an audio precompensation controller for an associated sound generating system, said sound generating system comprising a limited number $N \geqq 2$ of loudspeaker inputs for emulating a number $L \geqq 1$ of virtual sound sources, each virtual sound source having an input signal, said audio precompensation controller having said L input signals to the virtual sound sources as inputs and producing N signals as outputs, wherein said N outputs of said audio precompensation controller are used as input signals to the sound generating system, said audio precompensation controller having the property of producing output zero for some setting of its adjustable parameters, with said method comprising the steps of:

estimating, for of each of said N loudspeaker input signals, an impulse response at each of a plurality M of measurement positions in a listening environment based on sound measurements at said M measurement positions, wherein said M measurement positions are distributed in at least two spatially disjoint listening regions, each listening region having at least four measurement positions, where said listening regions correspond to different human listening positions and the distance between regions is larger than the largest distance between adjacent measurement positions within any region;

specifying a target impulse response for each of said L virtual sound sources at each of said M measurement positions in said spatially disjoint regions;

determining adjustable filter parameters of said audio precompensation controller so that a criterion function is optimized under the constraint of stability of the dynamics of the audio precompensation controller, with said criterion function including a weighted summation of powers of differences between the compensated estimated impulse responses and the target impulse responses over a discrete grid of said M measurement positions.

2. The method of claim 1, wherein a set of N audio filters are determined for each of a set of L sound source signals, and said audio controller comprises N×L scalar linear dynamic discrete-time precompensation filters with adjustable parameters that each have one of the L input signals to the virtual sound sources as inputs, and one of the N sound inputs to the loudspeakers as outputs.

3. An audio precompensation controller determined by using the method according to claim 2, for which some of the scalar filters that are matrix elements of the audio precompensation controller are realized as parallel connections between one nonzero FIR (Finite Impulse Response) tapped delay line filter and one IIR (Infinite Impulse Response) filter and where the IIR filter component is adjusted to be an approximation of the impulse response of the scalar precompensation filter within a set $[t_1, t_2]$ of time delays, where $t_1>1$ and $t_2>t_1$.

4. An audio precompensation controller of claim 3, where the IIR filter is realized as a parallel connection of component IIR filters or a series connection of component IIR filters, or a combination thereof.

5. The method of claim 1, wherein the distance between the listening regions is at least twice as large as the largest distance between adjacent measurement positions within any region.

6. The method of claim 1, wherein said step of determining filter parameters of said audio precompensation controller is based on a Linear Quadratic Gaussian (LQG) optimization of the parameters of a stable and linear multivariable feedforward servo filter based on the given target dynamic system, the dynamic model of the sound generating system, and on multivariable stochastic dynamic models that describe second order statistics of the virtual sound sources.

7. The method of claim 1, wherein said step of determining filter parameters of said audio precompensation controller is also based on adjusting filter parameters of said audio precompensation controller to reach a target magnitude response of the sound generating system including the audio controller in at least a subset of said M measurement positions.

8. The method of claim 7, wherein said step of adjusting filter parameters of said audio precompensation controller is based on evaluation of magnitude responses and thereafter determining a minimum phase filter model of the sound generating system including the audio controller in at least a subset of said M measurement positions.

9. The method of claim 1, where the target impulse responses are nonzero and include adjustable parameters that can be modified within prescribed limits.

10. The method of claim 9, where the adjustable parameters of the target impulse responses as well as the adjustable parameters of the audio precompensation controller are adjusted jointly, with the aim of optimizing the criterion function.

11. The method of claim 1, wherein said step of estimating, for of each of said N loudspeakers, an impulse response at each of a plurality M of measurement positions is based on a model describing the dynamic response of the associated sound generating system at said M measurement positions, for which said dynamic response differs for at least two of these measurement positions.

12. The method of claim 11, wherein said model is determined based on measurements of sound at M measurement positions, said sound being produced by said sound generating system, and said step of determining said set of N audio filters comprises the step of determining corresponding filter parameters, and said audio precompensation controller is created by implementing the determined filter parameters in an audio filter structure.

13. The method of claim 12, wherein said audio filter structure is embodied together with said associated sound generating system so as to enable generation of a desired target sound field at said M measurement positions in said listening environment.

14. The method of claim 1, wherein said sound generating system is a car audio system, and said listening environment is part of a car.

15. An audio precompensation controller determined by using the method according to claim 1.

16. An audio system comprising a sound generating system and an audio precompensation controller in the input path to said sound generating system, wherein said audio precompensation controller is determined by using the method according to claim 1.

17. A digital audio signal generated by an audio precompensation controller determined by using the method according to claim 1.

18. A system for determining an audio precompensation controller for an associated sound generating system, said sound generating system comprising a limited number N≧2 of loudspeaker inputs for emulating a number L≧1 of virtual sound sources, each virtual sound source having an input signal, said audio precompensation controller having said L input signals to the virtual sound sources as inputs and producing N signals as outputs, wherein said N outputs of said audio precompensation controller are used as input signals to the sound generating system, said audio precompensation controller having the property of producing output zero for some setting of its adjustable parameters, with said system comprising:

means for estimating, for of each of said N loudspeaker input signals, an impulse response at each of a plurality M of measurement positions in a listening environment based on sound measurements at said M measurement positions, wherein said M measurement positions are distributed in at least two spatially disjoint regions, each region having at least four measurement positions, where said listening regions correspond to different human listening positions and the distance between regions is larger than the largest distance between adjacent measurement positions within any region;

means for specifying a target impulse response for each of said L virtual sound sources at each of said M measurement positions in said spatially disjoint regions;

means for determining adjustable filter parameters of said audio precompensation controller so that a criterion function is optimized under the constraint of stability of the dynamics of the audio precompensation controller, with said criterion function including a weighted summation of powers of differences between the compensated estimated impulse responses and the target impulse responses over a discrete grid of said M measurement positions.

19. The system of claim 18, wherein said means for determining filter parameters of said audio precompensation controller is configured to operate based on a Linear Quadratic Gaussian (LQG) optimization of the parameters of a stable and linear multivariable feedforward servo filter based on the given target dynamic system, the dynamic model of the sound generating system, and on multivariable stochastic dynamic models that describe second order statistics of the virtual sound sources.

20. A computer program product for determining, when running on a computer system, an audio precompensation controller for an associated sound generating system, said sound generating system comprising a limited number N≧2 of loudspeaker inputs for emulating a number L≧1 of virtual sound sources, each virtual sound source having an input signal, said audio precompensation controller having said L input signals to the virtual sound sources as inputs and producing N signals as outputs, wherein said N outputs of said audio precompensation controller are used as input signals to the sound generating system, said audio precompensation controller having the property of producing output zero for some setting of its adjustable parameters, with said computer program product comprising:

program means for estimating, for of each of said N loudspeaker input signals, an impulse response at each of a plurality M of measurement positions in a listening environment based on sound measurements at said M measurement positions, wherein said M measurement positions are distributed in at least two spatially disjoint regions, each region having at least four measurement positions, where said listening regions correspond to different human listening positions and the distance between regions is larger than the largest distance between adjacent measurement positions within any region;

program means for specifying a target impulse response for each of said L virtual sound sources at each of said M measurement positions in said spatially disjoint regions;

program means for determining adjustable filter parameters of said audio precompensation controller so that a criterion function is optimized under the constraint of stability of the dynamics of the audio precompensation controller, with said criterion function including a weighted summation of powers of differences between the compensated estimated impulse responses and the target impulse responses over a discrete grid of said M measurement positions.

* * * * *